(12) United States Patent
Kong

(10) Patent No.: US 7,417,569 B2
(45) Date of Patent: Aug. 26, 2008

(54) SAMPLING RATE CONVERTER WITH NO TIMING DRIFT AND BOUNDED AMPLITUDE ERROR

(75) Inventor: Hongwei Kong, Denville, NJ (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/565,086

(22) Filed: Nov. 30, 2006

(65) Prior Publication Data

US 2008/0129557 A1   Jun. 5, 2008

(51) Int. Cl.
*H03M 7/00* (2006.01)
(52) U.S. Cl. ......................... 341/61; 341/155
(58) Field of Classification Search .......... 341/144, 341/155, 61

See application file for complete search history.

(56) References Cited

U.S. PATENT DOCUMENTS

| | | | | |
|---|---|---|---|---|
| 5,768,311 | A * | 6/1998 | Betts et al. | 375/222 |
| 6,226,661 | B1 * | 5/2001 | Savell | 708/313 |
| 6,362,755 | B1 * | 3/2002 | Tinker | 341/61 |
| 6,650,258 | B1 * | 11/2003 | Kelly et al. | 341/61 |

* cited by examiner

*Primary Examiner*—Brian Young
(74) *Attorney, Agent, or Firm*—McAndrews, Held & Malloy, Ltd.

(57) ABSTRACT

Aspects of a sampling rate converter with no timing drift and with bounded amplitude error are presented. Aspects of the method may include computing an intermediate sum by adding a numerator portion of a fractional conversion ratio to an accumulated time value upon receipt of an input data sample. A time instant for generating an output data sample may be determined by computing a modulus value for the intermediate sum, wherein a base for the modulus value computing may be a denominator portion of the fractional conversion ratio.

19 Claims, 4 Drawing Sheets

SAMPLING RATE CONVERTER WITH NO TIMING DRIFT AND BOUNDED AMPLITUDE ERROR

CROSS-REFERENCE TO RELATED APPLICATIONS/INCORPORATION BY REFERENCE

NOT APPLICABLE.

FIELD OF THE INVENTION

Certain embodiments of the invention relate to timing signal generation in a synchronous electronic system. More specifically, certain embodiments of the invention relate to a sampling rate converter with no timing drift and with bounded amplitude error.

BACKGROUND OF THE INVENTION

Many audio systems support applications for audio format conversion and/or audio mixing. Audio format conversion typically involves receiving input data that utilizes one audio format, for example MP3, which is subsequently converted to another audio format, for example Windows media audio (WMA). Audio mixing typically involves generating output audio data that is a compendium of audio data from a plurality of input sources. In applications, such as audio format conversion and audio mixing, sampling rate conversion is often performed. Sampling rate conversion typically involves receiving input data samples at an input data rate, or source sampling frequency, and generating output data samples at an output data rate, or target sampling frequency, which is different from the input data rate. For example, in an audio mixing application, data from different input sources are often characterized by different sampling rates. The ratio of the source sampling frequency and target sampling frequency is referred to as the "conversion ratio". Exemplary audio systems that support audio format conversion and/or audio mixing applications may include software-define radio systems, multimedia mobile handsets, and digital signal synthesizer systems.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A sampling rate converter, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Figure 1:
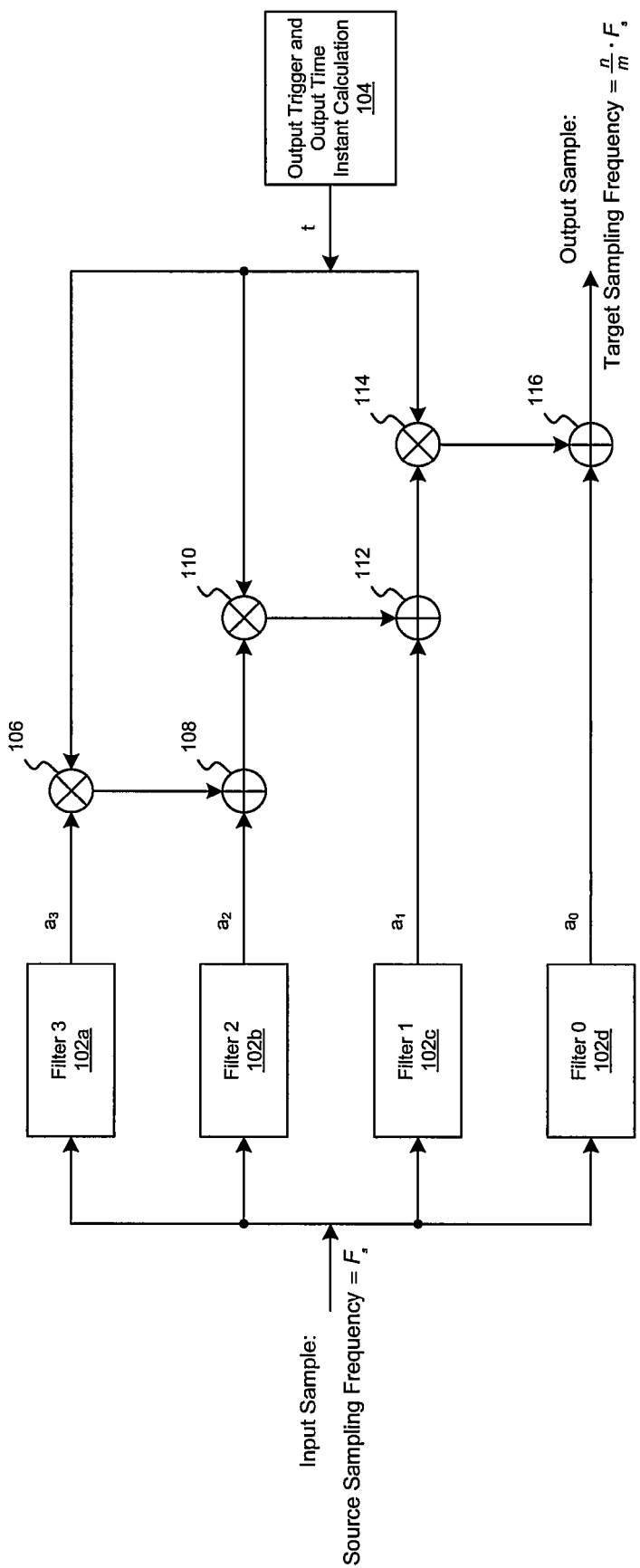
FIG. 1 is a diagram illustrating an exemplary method for sample rate conversion, in accordance with an embodiment of the invention.

Certain embodiments of the invention may be found in a sampling rate converter with no timing drift and with bounded amplitude error. Various embodiments of the invention may comprise a method for performing sampling rate conversion, which limits the accumulation of quantization errors that may lead to output time drifting. The limiting of accumulated quantization errors may, in turn, reduce errors in the timing of the output samples, and/or amplitudes of output samples, in comparison with current sample rate conversion methods.

The conversion ratio may be an integer value, or a non-integer value, which comprises an integer portion and a fractional portion. When the conversion ratio is not an integer value two current methods for sampling rate conversion are as described below.

The first current method for sampling rate conversion for non-integer conversion ratio is described in code fragment 1 as follows:

Receive Input Data: Source Sampling Frequency=$F_s$;

Generate Intermediate Data by Up-Sampling Input Data by Factor of "n" by Inserting n−1 Zero-Valued Samples between Each Consecutive Pair of Samples in Input Data: Intermediate Sampling Frequency=$n \cdot F_s$;

Apply Band-Limiting Filter to Intermediate Data. The filter is typically implemented as an infinite impulse response filter (IIR), or as a finite impulse response (FIR) filter; and Generate Output Data by Down-Sampling Intermediate Data by Factor of "m" by Taking 1 Sample in Each Consecutive Set of m Samples in Intermediate Data: Target Sampling $$\text{Frequency} = \frac{n}{m} \cdot F_s;$$

where conversion $$\text{ratio} = \frac{m}{n}.$$

One limitation associated with the first sampling rate conversion method described code fragment 1 above, is that for large values of the up-sampling factor, n, or down-sampling factor m, large amounts of storage capacity may be utilized in memory circuitry, such as random access memory (RAM), for storage of coefficients that are utilized in IIR or FIR filtering. The conversion may require a large number of multiplication operations, which may translate into increased hardware complexity and/or higher levels of required processing performance (as measured in MIPs, for example) in hardware, for example digital signal processors (DSP).

The second current method for sampling rate conversion for non-integer conversion ratio is as described in pseudo-code fragment 2 as follows:

```
IntD = floor(m/n);              # integer part of conversion ratio

FracD = remainder(m/n, 1);      # fractional part of conversion ratio

Int_reg = IntD + 1;             # register for input sample count to
                                  trigger output calculation
frac_reg = 0;                   # register for output sample time instant
LOOP Input_Sample begin:end     # loop through input from
                                  beginning to end
    Int_reg = Int_reg - 1;      # decrement integer input sample count
    IF Int_reg == 0             # calculate a new output sample
        frac_reg = remainder    # output sample time instant
        (frac_reg + FracD,1);
        IF frac_reg + FracD≧1   # determine whether to skip next
                                  input sample
            Int_reg = IntD + 1; # skip next input sample
        ELSE
            Int_reg = IntD;     # output next input sample
        End IF
        t = frac_reg;           # output time instant for
                                  polynomial calculation
                                # perform polynomial calculation
        Output_Sample = (a₀ + a₁·t + a₂·t² a₃·t³);
    End IF
End LOOP
``` where $0 \leq t \leq 1$, and $a_0$, $a_1$, $a_2$, and $a_3$ are filtered version of the Input_Sample. The expression remainder (x,y) returns a modulus y value for x.

One limitation associated with the second sampling rate conversion method described above pseudo-code fragment 2, is due to quantization errors associated with the values FracD and t in the pseudo-code fragment 2. The quantization errors may result from encoding the values FracD and t in binary word format for which the resolution is limited based on the number of bits contained in the binary word format. As can be seen, pseudo-code fragment 2, values of frac_reg are derived by iteratively accumulating the value FracD for each calculation of a new output sample. As can also be seen in the pseudo-code fragment 2, values of t are derived from values of frac_reg. Consequently, the variable t contains an accumulation of quantization error values from each iterative accumulation of FracD in the variable frac_reg. This results in time drifting in the output sample. Time drifting is a phenomenon, which causes an output sample to appear in an output signal sooner than it should have been output, or later than it should have been output. The amount of such time drifting may increase with time. As can be seen in the polynomial calculation of the Output_Sample in pseudo-code fragment 2, errors in the value of the output time instant, t, may not only cause an Output_Sample to appear at the wrong time instant, but may also result in errors in the amplitude of the Output_Sample.

For small values of the down-sampling factor, m, the tendency for time drifting may be reduced by pre-computing m possible values for the value t. The pre-computed values may then be stored in memory. However, for large values of m, this approach may require large amounts of storage capacity in the memory circuitry.

FIG. 1 is a diagram illustrating an exemplary method for sample rate conversion, in accordance with an embodiment of the invention. Referring to FIG. 1, there is shown a plurality of filter blocks 102a, 102b, 102c, and 102d, an output trigger and time calculation block 104, a plurality of multiplication blocks 106, 110, and 114, and a plurality of addition blocks 108, 112, and 116. Various aspects of the method shown in FIG. 1 may be implemented in hardware comprising integrated circuitry, and/or one or more processors and/or memory devices.

The filter blocks 102a, 102b, 102c, and 102d may each receive an input sample, for which the corresponding source sampling frequency=$F_S$. The filter block 102d may represent a method of filtering an input sample to produce an output value represented in FIG. 1 by the reference label $a_0$. The filter block 102c may represent a method of filtering an input sample to produce an output value represented in FIG. 1 by the reference label $a_1$. The filter block 102b may represent a method of filtering an input sample to produce an output value represented in FIG. 1 by the reference label $a_2$. The filter block 102a may represent a method of filtering an input sample to produce an output value represented in FIG. 1 by the reference label $a_3$.

The output trigger and time calculation block 104 may represent a method for calculating an output time instant, t, in accordance with an embodiment of the invention.

The multiplication blocks 106, 110, and 114 may each represent a method for calculating an output value that may be equal to the multiplicative product of received input values. The addition blocks 108a, 112, and 116 may each represent a method for calculating an output value that may be equal to the additive sum of received input values.

The multiplication block 106 may compute an output value based on input values $a_3$ and t. The addition block 108 may compute an output value based on the input value $a_2$ and the multiplicative product from multiplication block 106, $a_3 \cdot t$. The multiplication block 110 may compute an output value based on the input value t, and the additive sum from the addition block 108, $a_2 + a_3 \cdot t$. The addition block 112 may compute an output value based on the input value $a_1$ and the multiplicative product from multiplication block 110, $a_2 \cdot t + a_3 \cdot t^2$. The multiplication block 114 may compute an output value based on the input value t, and the additive sum from the addition block 112, $a_1 + a_2 \cdot t + a_3 \cdot t^2$. The addition block 116 may compute an output value based on the input value $a_0$ and the multiplicative product from the multiplication block 114, $a_1 \cdot t + a_2 \cdot t^2 + a_3 \cdot t^3$. The output sample may be equal to the output from the addition block 116, $a_0 + a_1 \cdot t + a_2 \cdot t^2 + a_3 \cdot t^3$. The corresponding target sampling $$\text{frequency} = \frac{n}{m} \cdot F_s.$$

An exemplary method for sampling rate conversion for non-integer conversion ratio, in accordance with an embodiment of the invention is as described in pseudo-code fragment 3 as follows:

```
IntD = floor(conversion_ratio);        # integer part of conversion ratio
FracD = remainder(conversion_ratio,1); # fractional part of
                                         conversion ratio
FracD_Numerator;                       # numerator of FracD
FracD_Denominator;                     # denominator of FracD
Int_reg = IntD + 1;                    # register for input sample count
                                         to trigger output calculation
frac_reg = 0;                          # register for output sample time instant
LOOP Input_Sample begin:end            # loop through input from
                                         beginning to end
    Int_reg = Int_reg - 1;             # decrement integer input sample count
    IF Int_reg == 0                    # calculate a new output sample
                                       # output sample time instant
        frac_reg = remainder (frac_reg +
        FracD_Numerator,FracD_Denominator);
```

-continued

```
                                    # determine whether to skip
                                      next input sample
        IF frac_reg + FracD_Numerator ≧
        FracD_Denominator Int_reg =
        IntD + 1;
                                    # skip next input sample
        ELSE
            Int_reg = IntD;         # output next input sample
        End IF
        t_integer = frac_reg;       # spline calculation
                                      of output time instant t = t_integer / FracD_Denominator;   # output time instant for
                                           polynomial calculation perform polynomial calculation
        Output_Sample = (a₀ + a₁ · t + a₂ · t² a₃ · t³);
        End IF
End LOOP
``` where $a_0$, $a_1$, $a_2$, and $a_3$ are filtered version of the Input_Sample, and the output time instant t is computed by the output trigger and output time calculation block, as shown in FIG. 1.

The exemplary method for sampling rate conversion is distinct from the method pseudo-code fragment 2. In one aspect, during the computation of the output sample time instant in the pseudo-code fragment 2:

$$frac\_reg = \text{remainder}(frac\_reg + FracD, 1); \quad [1]$$

the variable frac_reg accumulates instances of the variable FracD, which contains quantization error from the computation of the conversion ratio, $$\frac{m}{n}.$$

Thus, the computation of the output sample time in the method presented in pseudo-code fragment 2 may accumulate quantization errors resulting in timing drift in output sample timing. In the computation of the output sample time instant as presented in pseudo-code fragment 3 in accordance with the invention:

$$frac\_reg = \text{remainder}(frac\_reg + FracD\_\text{Numerator}, FracD\_\text{Denominator}); \quad [2]$$

the variable frac_reg accumulates instances of the integer FracD_Numerator. The remainder in equation [2] is then the integer remainder from modulus FracD_Denominator=n value of the accumulated result of the sum of frac_reg and FracD_Numerator. Since equation [2] operates on integers, various embodiments of the invention, as presented in pseudo-code fragment 3, may compute an output sample time instant without incurring quantization errors resulting in accumulated timing drift during the calculation.

In another aspect, during computation of the output time instant utilized for polynomial calculation of the output sample amplitude as presented in pseudo-code fragment 2:

$$t = frac\_reg; \quad [3]$$

Thus, the accumulated quantization error in the output sample timing may also be propagated to the calculation of the output sample amplitude. In the polynomial calculation of the output sample amplitude as presented in pseudo-code fragment 3:

$$t = \frac{t\_integer}{FracD\_Denominator}; \quad [4]$$

Thus, in various embodiment of the invention as presented in pseudo-code fragment 3, the quantization error resulting from the division does not propagate from one sample a subsequent sample, but may be bounded based on the bit width of the binary word utilized to quantize the division result as shown in equation [4]. Consequently, quantization error may not accumulate during the calculation of the output sample amplitude but may be correspondingly bounded.

An alternative exemplary method for sampling rate conversion for non-integer conversion ratio, in accordance with an embodiment of the invention is as described in the pseudo-code fragment 4 as follows:

```
IntD = floor(conversion_ratio);      # integer part of conversion ratio
FracD = remainder(conversion_ratio, 1);  # fractional part of conversion
                                           ratio
FracD_Numerator;                     # numerator of FracD
FracD_Denominator;                   # denominator of FracD
Int_reg = IntD + 1;                  # register for input sample count to
                                       triggger output calculation
frac_reg = 0;                        # register for output sample time
                                       instant
t_reg = 0;                           #time instant to be used for spline
                                       evaluation
LOOP Input_Sample begin:end          # loop through input from beginning
                                       to end
    Int_reg = Int_reg – 1;           # decrement integer input sample
                                       count
    IF Int_reg == 0                  # calculate a new output sample
                                     # output sample time instant
        frac_reg = remainder(frac_reg + FracD_Numerator,
          FracD_Denominator);
                                     # determine whether to reload value
                                       to t or to continue accumulating to t
        IF frac_reg == FracD_Numerator
            t_reg = FracD;
        ELSE
            t_reg = remainder(t_reg + FracD, 1);
        End IF
                                     # determine whether to skip next
                                       input sample
        IF frac_reg + FracD_Numerator ≧ FracD_Denominator
            Int_reg = IntD + 1;      # skip next input sample
        ELSE
            Int_reg = IntD;          # output next input sample
        End IF
        t = t_reg;                   # spline calculation of output time
                                       instant
        Output_Sample = (a₀ + a₁ · t + a₂ · t² + a₃ · t³);
                                     # perform polynomial calculation
    End IF
End LOOP
```

In the exemplary method for sampling rate conversion as presented in pseudo-code fragment 4, during the computation of the output sample time instant:

$$t\_reg = \text{remainder}(t\_reg + FracD, 1); \quad [5]$$

quantization error may be accumulated as described for equation [1]. However, in various embodiments of the invention as presented in pseudo-code fragment 4, the quantization error may be bounded based on the condition:

$$frac\_reg == FracD\_\text{Numerator} \quad [6]$$

which, when true, results in a reset of the t_reg output sample time instant variable as shown in pseudo-code fragment 4:

t_reg=FracD; [7]

Thus, when the accumulated fra_reg value equals the value FracD_Numerator, as shown in equation [6], the t_reg value is reset to the value FracD, which may contain quantization error from the conversion ratio, but may not contain quantization errors that were accumulated over a sequence of computed output samples. Thus, in various embodiments of the invention, as presented in pseudo-code fragment 4, quantization errors in the computation of the output sample time instant may be bounded.

In another aspect, during computation of the output time instant utilized for polynomial calculation of the output sample amplitude as presented in pseudo-code fragment 4:

t=t_reg; [8]

In various embodiments of the invention as presented in pseudo-code fragment 4, the extent to which accumulated quantization error in the output sample timing may also be propagated to the calculation of the output sample amplitude may also be bounded based on the condition as shown in equation [6].

Figure 2:
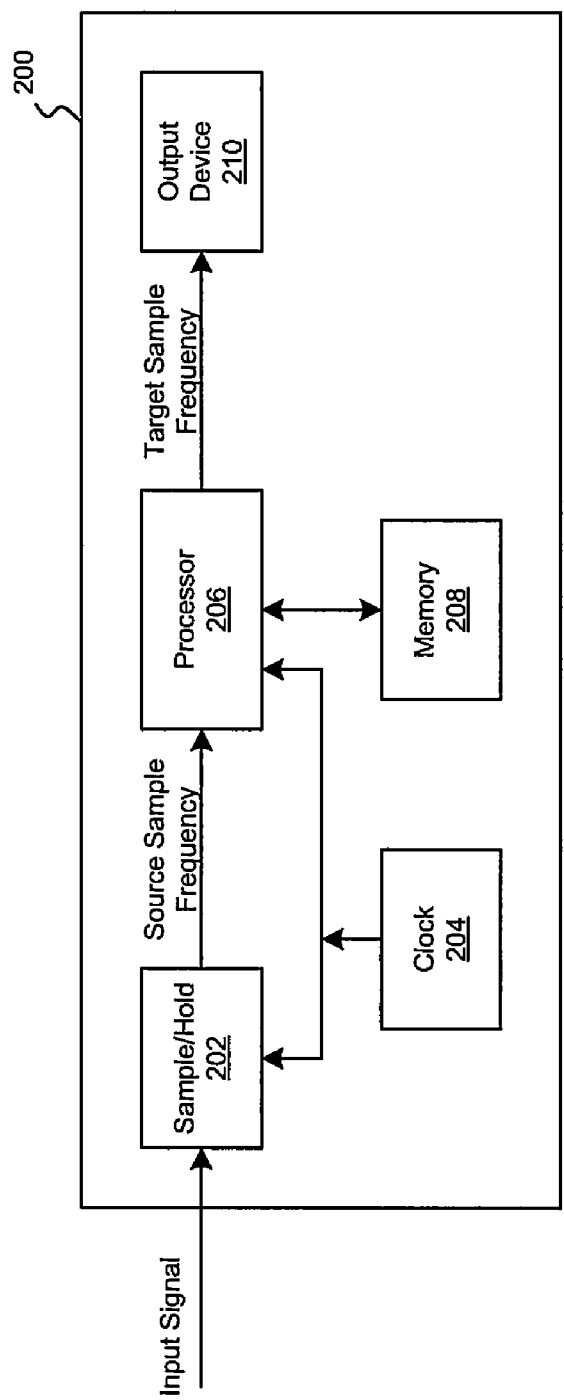
FIG. 2 is an exemplary system for sampling rate conversion, which may be utilized in connection with an embodiment of the invention.

FIG. 2 is an exemplary system for sampling rate conversion, which may be utilized in connection with an embodiment of the invention. Referring to FIG. 2, there is shown a system for sampling rate conversion 200. The system for sampling rate conversion 200 may comprise a sample and hold (sample/hold) block 202, a clock block 204, a processor 206, a memory block 208, and an output device block 210.

The clock block 204 may comprise suitable logic, circuitry, and/or code that may enable generation of timing signals. The sample/hold block 202 may comprise suitable logic, circuitry, and/or code that may enable reception of an input signal, and generation of input samples for which the corresponding source sampling frequency=$F_S$. The sample/hold block 202 may sample the input signal, and/or generate input samples based on timing signals from the clock block 204. The memory block 208 may comprise suitable logic, circuitry, and/or code that may enable the storage and/or retrieval of data. The data may comprise input samples, intermediate samples, and/or output samples. The processor 206 may comprise suitable logic, circuitry, and/or code that may enable reception of input samples, and generation of output samples for which the corresponding target sampling $$\text{frequency} = \frac{1}{\text{conversion\_ratio}} \cdot F_s.$$

The processor 206 may receive input samples from the sample/hold block 202, and/or from the memory 208. The processor 206 may also store input samples, intermediate samples, and/or output samples in the memory 208. The processor may also retrieve intermediate samples, and/or output samples from the memory 208. The processor 206 may compute output time instants, t, for the outputting of output samples, in addition to interpolating amplitudes for output data. The processor 206 may receive input samples and/or interpolate output samples based on timing signals from the clock block 204. The output device 210 may comprise suitable logic, circuitry, and/or code that may enable transformation of output samples for presentation on a user interface device, for example, an audio speaker.

Figure 3:
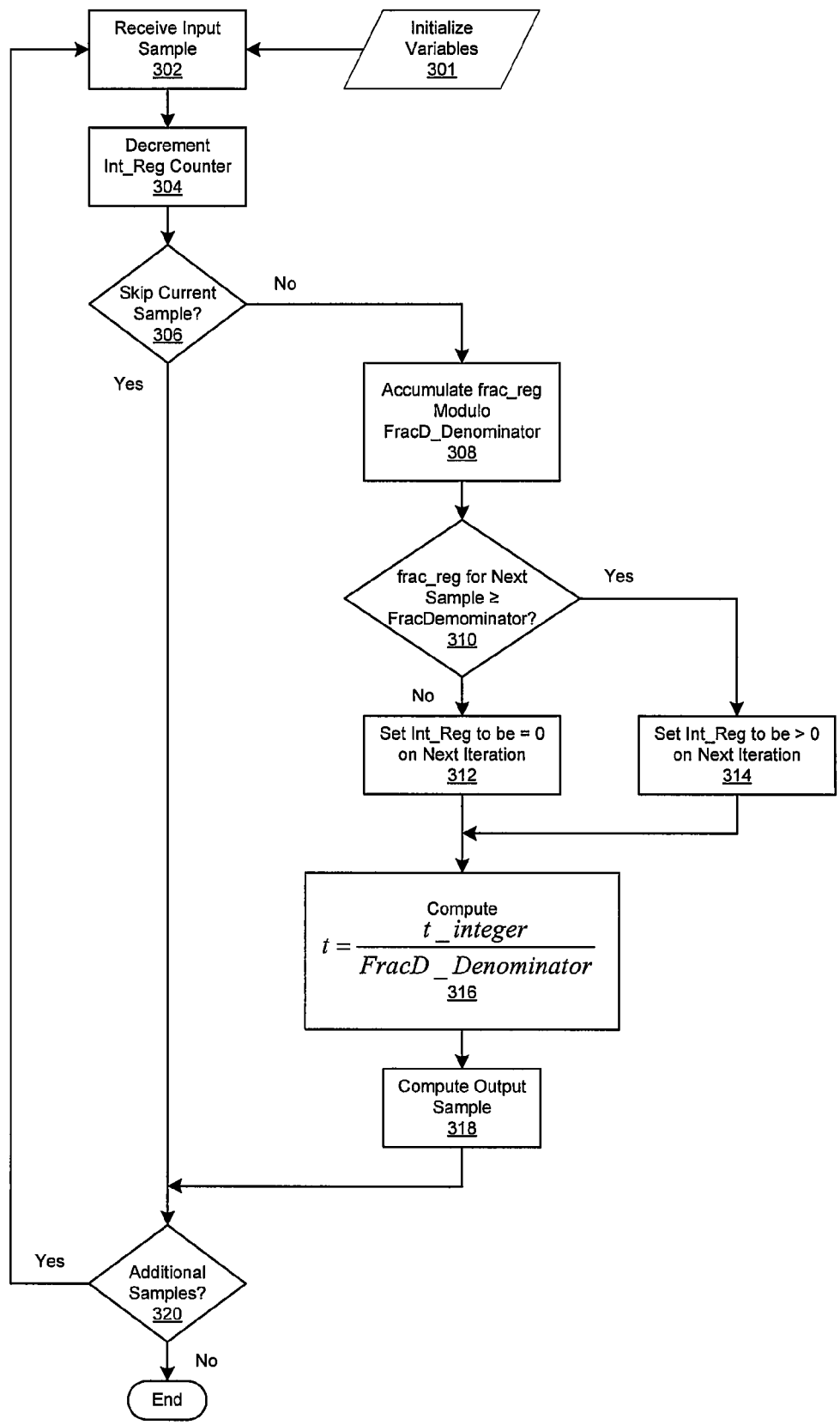
FIG. 3 is a flowchart illustrating exemplary steps for sampling rate conversion, in accordance with an embodiment of the invention.

FIG. 3 is a flowchart illustrating exemplary steps for sampling rate conversion, in accordance with an embodiment of the invention. FIG. 3 substantially follows the pseudo-code segment as presented in pseudo-code fragment 3. In step 301, parameters, such as indicated in the pseudo-code segments above, may be set to initial values. In step 302, an input sample may be received. In step 304, the Int_Reg counter variable may be decremented. Based on the value of the Int_Reg variable, step 306 may determine whether to skip the current input sample, or to generate an output sample.

If the value Int_Reg equals 0, the input sample may be skipped, and step 320 may follow. Step 320, may determine whether there are additional input samples to be received. If step 320 determines that there are no further input samples to be received, the method may reach an End. If step 320 determines that there are additional input samples to be received, step 302 may follow.

If the value Int_Reg is not equal to 0, step 308 may accumulate an instance of the value FracD_Numerator into the output time instance variable frac_reg, where the final value frac_reg in step 308 may be a modulus FracD_Denominator value. Step 310 may determine whether the accumulated frac_reg value for the next sample may be greater than or equal to the value FracD_Denominator. If step 310 determines that the frac_reg value for the next sample is expected to be greater the value FracD_Denominator, in step 314, the value Int_Reg may be set such that the value may be greater than 0 during the next sample. If step 310 determines that the frac_reg value for the next sample is not expected to be greater the value FracD_Denominator, in step 312, the value Int_Reg may be set such that the value may be equal to 0 during the next sample. Step 316 may follow either step 312 or step 314.

In step 316, the value t, for polynomial calculation of the output sample amplitude may be computed as shown in equation [4]. In step 318, the output sample polynomial calculation may be performed as presented in pseudo-code fragment 3:

Output_Sample($a_0+a_1 \cdot t+a_2 \cdot t^2+a_3 \cdot t^3$); [9]

Step 320 may follow step 318.

Figure 4:
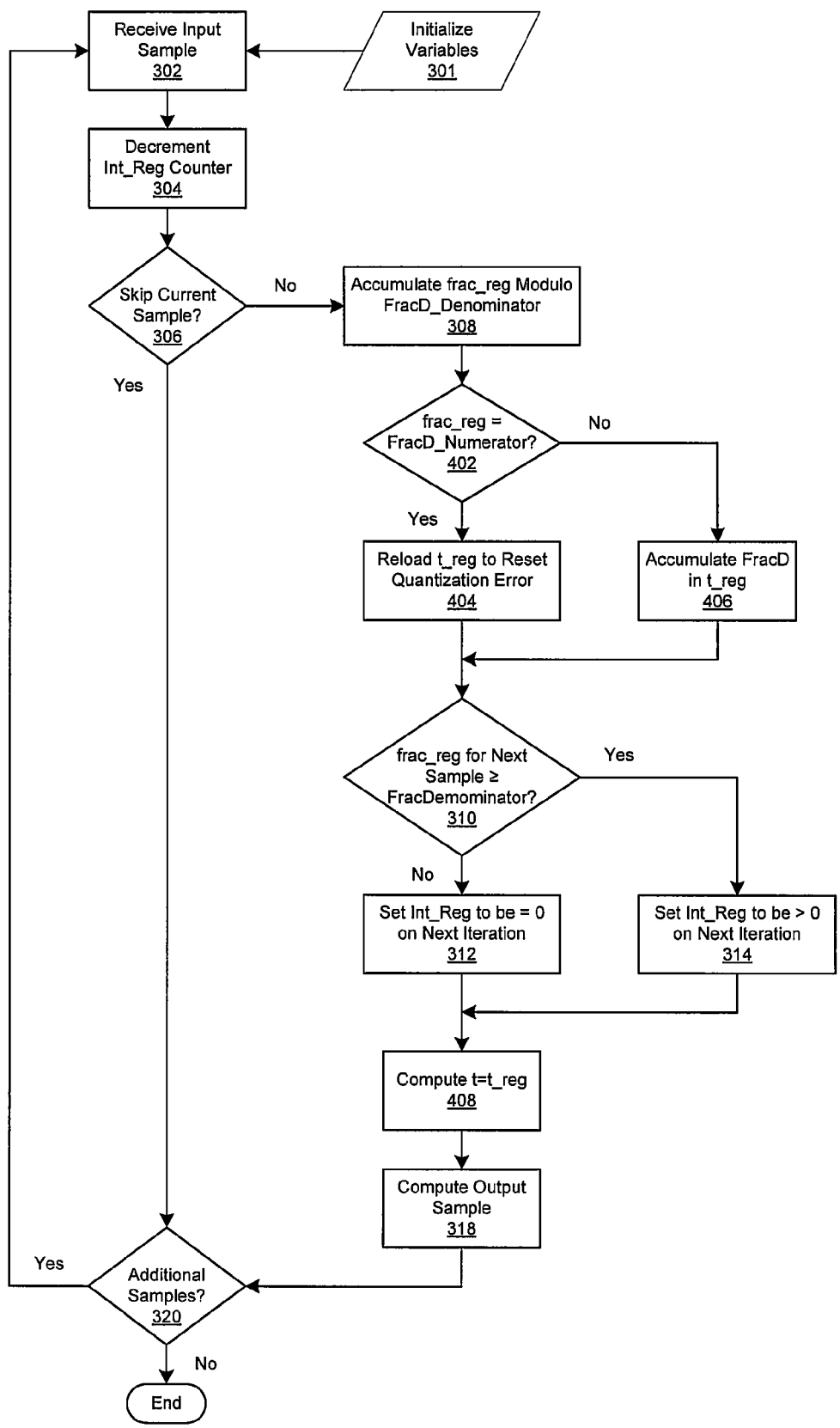
FIG. 4 is a flowchart illustrating exemplary steps for sampling rate conversion, in accordance with an alternative embodiment of the invention.

FIG. 4 is a flowchart illustrating exemplary steps for sampling rate conversion, in accordance with an alternative embodiment of the invention. FIG. 4 substantially follows the pseudo-code segment as presented in pseudo-code fragment 4. In step 301, parameters, such as indicated in the pseudo-code segments above, may be set to initial values. In step 302, an input sample may be received. In step 304, the Int_Reg counter variable may be decremented. Based on the value of the Int_Reg variable, step 306 may determine whether to skip the current input sample, or to generate an output sample.

If the value Int_Reg equals 0, the input sample may be skipped, and step 320 may follow. Step 320, may determine whether there are additional input samples to be received. If step 320 determines that there are no further input samples to be received, the method may reach an End. If step 320 determines that there are additional input samples to be received, step 302 may follow.

If the value Int_Reg is not equal to 0, step 308 may accumulate an instance of the value FracD_Numerator into the output time instance variable frac_reg, where the final value frac_reg in step 308 may be a modulus FracD_Denominator value.

Step 402 may determine whether the accumulated frac_reg value is equal to the value FracD_Numerator. If step 402 determines that the accumulated frac_reg value is equal to the value FracD_Numerator, in step 404, the value t_reg, utilized for polynomial calculation of the output sample amplitude, may be reset to a value about equal the fractional portion of the conversion ratio. In one aspect, step 404 may cancel at least a portion of accumulated quantization error that had, to that point, accumulated in the frac_reg value. If step 402 determines that the accumulated frac_reg value is not equal to the value FracD_Numerator, in step 406, an instance of the value FracD may be accumulated in the variable t_reg. Step 310 may follow either step 404 or step 406.

Step 310 may determine whether the accumulated frac_reg value for the next sample may be greater than or equal to the value FracD_Denominator. If step 310 determines that the frac_reg value for the next sample is expected to be greater the value FracD_Denominator, in step 314, the value Int_Reg may be set such that the value may be greater than 0 during the next sample. If step 310 determines that the frac_reg value for the next sample is not expected to be greater the value FracD_Denominator, in step 312, the value Int_Reg may be set such that the value may be equal to 0 during the next sample. Step 408 may follow either step 312 or 314. In step 408, the value t, for polynomial calculation of the output sample amplitude may be computed as shown in equation [8]. In step 318, the output sample polynomial calculation may be performed as shown in equation [9]. Step 320 may follow step 318.

Aspects of a sampling rate converter with no timing drift and bounded amplitude error may comprise at least one processor 206 that enables computation of an intermediate sum by adding a numerator portion of a fractional conversion ratio to an accumulated time value upon receipt of an input data sample. A time instant for generating an output data sample may be determined by computing a modulus value for the intermediate sum, wherein a base for the modulus value computing may be a denominator portion of the conversion ratio. The conversion ratio may be a non-integer value.

The at least one processor 206 may enable computation of a time value for computation of an amplitude for the output data sample by dividing the computed modulus value by the denominator portion of the conversion ratio. The amplitude for the output data sample may be computed based on the computed time value and the input data sample. The input data sample may be filtered.

In an alternative embodiment of the invention, the at least one processor 206 may enable computation of a time value for computation of an amplitude for the output data sample by computing either the fractional conversion ratio, or a fractional portion of a value computed by adding the fractional conversion ratio to a second accumulated time value. Comparing the computed modulus value to the numerator portion of the fractional conversion ratio may enable selection of the fractional conversion ratio, or the fraction portion of the value computed by adding the fractional conversion ratio to a second accumulated time value.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A machine-readable storage having stored thereon, a computer program having at least one code section for sample rate conversion in a digital system, the at least one code section being executable by a machine for causing the machine to perform steps comprising:

computing an intermediate sum by adding a numerator portion of a fractional conversion ratio to an accumulated time value upon receipt of an input data sample; and determining a time instant for generating an output data sample by computing a modulus value for said intermediate sum, wherein a base for said modulus value computing is a denominator portion of said fractional conversion ratio.

2. The machine-readable storage according to claim 1, wherein said at least one code section comprise code for computing a time value for computation of an amplitude for said output data sample by dividing said computed modulus value by said denominator portion of said fractional conversion ratio.

3. The machine-readable storage according to claim 2, wherein said at least one code section comprise code for computing said amplitude for said output data sample based on said computed time value and said input data sample.

4. The machine-readable storage according to claim 3, wherein said input data sample is filtered.

5. The machine-readable storage according to claim 1, wherein said at least one code section comprise code for computing a time value for computation of an amplitude for said output data sample by computing one of: said fractional conversion ratio, or a fractional portion of a value computed by adding said fractional conversion ratio to a second accumulated time value.

6. The machine-readable storage according to claim 5, wherein said at least one code section comprise code for comparing said computed modulus value to said numerator portion of said fractional conversion ratio for selecting said one of: said fractional conversion ratio, or said fractional portion of said value computed by adding said fractional conversion ratio to said second accumulated time value.

7. The machine-readable storage according to claim 1, wherein said fractional conversion ratio is a non-integer value.

8. A method for sample rate conversion in a digital system, the method comprising:

computing an intermediate sum by adding a numerator portion of a fractional conversion ratio to an accumulated time value upon receipt of an input data sample;

determining a time instant for generating an output data sample by computing a modulus value for said intermediate sum, wherein a base for said modulus value computing is a denominator portion of said fractional conversion ratio; and computing a time value for computation of an amplitude for said output data sample by dividing said computed modulus value by said denominator portion of said fractional conversion ratio.

9. The method according to claim 8, comprising computing said amplitude for said output data sample based on said computed time value and said input data sample.

10. The method according to claim 9, wherein said input data sample is filtered.

11. A method for sample rate conversion in a digital system, the method comprising:

computing an intermediate sum by adding a numerator portion of a fractional conversion ratio to an accumulated time value upon receipt of an input data sample;

determining a time instant for generating an output data sample by computing a modulus value for said intermediate sum, wherein a base for said modulus value computing is a denominator portion of said fractional conversion ratio; and computing a time value for computation of an amplitude for said output data sample by computing one of: said fractional conversion ratio, or a fractional portion of a value computed by adding said fractional conversion ratio to a second accumulated time value.

12. The method according to claim 11, comprising comparing said computed modulus value to said numerator portion of said fractional conversion ratio for selecting said one of: said fractional conversion ratio, or said fractional portion of said value computed by adding said fractional conversion ratio to said second accumulated time value.

13. A method for sample rate conversion in a digital system, the method comprising:

computing an intermediate sum by adding a numerator portion of a fractional conversion ratio to an accumulated time value upon receipt of an input data sample; and determining a time instant for generating an output data sample by computing a modulus value for said intermediate sum, wherein a base for said modulus value computing is a denominator portion of said fractional conversion ratio;

wherein said fractional conversion ratio is a non-integer value.

14. A system for sample rate conversion in a digital system, the system comprising:

at least one processor that enables computation of an intermediate sum by adding a numerator portion of a fractional conversion ratio to an accumulated time value upon receipt of an input data sample;

said at least one processor enables determination of a time instant for generating an output data sample by computing a modulus value for said intermediate sum, wherein a base for said modulus value computing is a denominator portion of said fractional conversion ratio; and said at least one processor enables computation of a time value for computation of an amplitude for said output data sample by dividing said computed modulus value by said denominator portion of said fractional conversion ratio.

15. The system according to claim 14, wherein said at least one processor enables computation of said amplitude for said output data sample based on said computed time value and said input data sample.

16. The system according to claim 15, wherein said input data sample is filtered.

17. A system for sample rate conversion in a digital system, the system comprising:

at least one processor that enables computation of an intermediate sum by adding a numerator portion of a fractional conversion ratio to an accumulated time value upon receipt of an input data sample;

said at least one processor enables determination of a time instant for generating an output data sample by computing a modulus value for said intermediate sum, wherein a base for said modulus value computing is a denominator portion of said fractional conversion ratio; and said at least one processor enables computation of a time value for computation of an amplitude for said output data sample by computing one of: said fractional conversion ratio, or a fractional portion of a value computed by adding said fractional conversion ratio to a second accumulated time value.

18. The system according to claim 17, wherein said at least one processor enables comparison of said computed modulus value to said numerator portion of said fractional conversion ratio for selecting said one of: said fractional conversion ratio, or said fractional portion of said value computed by adding said fractional conversion ratio to said second accumulated time value.

19. A system for sample rate conversion in a digital system, the system comprising:

at least one processor that enables computation of an intermediate sum by adding a numerator portion of a fractional conversion ratio to an accumulated time value upon receipt of an input data sample; and said at least one processor enables determination of a time instant for generating an output data sample by computing a modulus value for said intermediate sum, wherein a base for said modulus value computing is a denominator portion of said fractional conversion ratio;

wherein said fractional conversion ratio is a non-integer value.

* * * * *